US009106226B2

(12) United States Patent
Shuvalov (10) Patent No.: US 9,106,226 B2
(45) Date of Patent: Aug. 11, 2015

(54) POWER SWITCHING APPARATUS AND METHOD FOR IMPROVING CURRENT SENSE ACCURACY

(75) Inventor: Denis Shuvalov, Zelenograd (RU)

(73) Assignee: Freescale Semiconductor, Inc., Austin, TX (US)

(*) Notice: Subject to any disclaimer, the term of this patent is extended or adjusted under 35 U.S.C. 154(b) by 415 days.

(21) Appl. No.: 13/698,122

(22) PCT Filed: May 21, 2010

(86) PCT No.: PCT/RU2010/000257
§ 371 (c)(1),
(2), (4) Date: Nov. 15, 2012

(87) PCT Pub. No.: WO2011/145970
PCT Pub. Date: Nov. 24, 2011

(65) Prior Publication Data
US 2013/0057241 A1    Mar. 7, 2013

(51) Int. Cl.
*G05F 3/30* (2006.01)
*H03K 17/12* (2006.01)

(52) U.S. Cl.
CPC .................................. *H03K 17/122* (2013.01)

(58) Field of Classification Search
CPC .............................. G01R 19/0084; G05F 3/30
USPC .......... 323/285, 234, 312, 316; 327/407, 581, 327/566, 427, 561, 434, 274, 316, 282
See application file for complete search history.

(56) References Cited

U.S. PATENT DOCUMENTS

| 6,304,108 | B1 | 10/2001 | Inn |
| 6,737,856 | B2* | 5/2004 | Sander ...................... 324/762.09 |
| 7,102,337 | B2* | 9/2006 | Wheeler et al. ............... 323/282 |
| 7,151,361 | B2* | 12/2006 | Xi ................................. 323/222 |
| 7,180,278 | B2* | 2/2007 | Tai et al. ....................... 323/280 |
| 7,245,116 | B2 | 7/2007 | Tateno et al. |
| 7,279,954 | B2* | 10/2007 | Throngnumchai et al. ... 327/512 |
| 7,385,380 | B2* | 6/2008 | Ishigaki et al. ............... 323/285 |
| 8,325,451 | B2* | 12/2012 | Mitsuda ...................... 361/93.1 |
| 2002/0024376 | A1 | 2/2002 | Sander |
| 2010/0244947 | A1* | 9/2010 | Massie et al. ................. 327/581 |

FOREIGN PATENT DOCUMENTS

DE    102004041886 A1    3/2006

OTHER PUBLICATIONS

International Search Report and Written Opinion correlating to PCT/RU2010/000257 dated Apr. 1, 2011.

* cited by examiner

*Primary Examiner* — Adolf Berhane
*Assistant Examiner* — Sisay G Tiku (57) ABSTRACT

The power switching apparatus includes an output arranged to provide a sense current depending on a load current, a power switching device, a sense device, and a difference amplification device. The difference amplification device includes a first and a second amplifier input, at least one amplifier output connected to a current sense feedback loop arranged to reduce a difference of potentials between the first and the second amplifier input. A terminal of the power switching device and a terminal of the sense device are connected to an input and another terminal of the power switching device and a second terminal of the sense device are coupled to a first cross-coupling switching module.

12 Claims, 6 Drawing Sheets

POWER SWITCHING APPARATUS AND METHOD FOR IMPROVING CURRENT SENSE ACCURACY

FIELD OF THE INVENTION

This invention relates to a power switching apparatus and a method for improving current sense accuracy in a power switching apparatus.

BACKGROUND OF THE INVENTION

In electronics, a switch is an electrical component that can break an electrical circuit, interrupting the current or diverting it from one conductor to another. When a switch is designed to switch significant power, the transitional state of the switch as well as the ability to stand continuous operating currents must be considered. When a switch is in the on state its resistance is very low and very little power is dropped in the contacts. When a switch is in the off state its resistance is extremely high and even less power is dropped in the contacts. However, when the switch is actuated, the resistance must pass through a state where a considerable portion of the load's rated power is dropped in the switch, demanding robust switching devices. The electrical actuator for a motor, a magnet, a valve or lamp may therefore for example be activated by a power switch.

An objective for example in the automobile industry is to activate anything that for example rotates, slides, pumps or heats by means of power semiconductors. "Smart" power switching circuits, such as for example Freescale's "eXtreme switch" devices, may be used for example in vehicles, e.g. cars or trucks, for driving different types of loads such as for example bulb-lamps or DC-motors.

In a power switching apparatus, a power switching circuit may work together with a microcontroller unit or processing device which may control the power swtiching circuit by mean of some communication interface. Smart power switching circuits can be configured to perform additional functions, such as for example protecting lines against short-circuits, sensing the current flow at any given time and providing the sense current through terminal CSNS, load diagnostics, for example over-temperature detection or open-load detection, and load control, which may be adapted to requirements by means of pulse width modulation (PWM), and suppressing electromagnetic interference during the process of switching.

Especially current sensing of load current can be an important additional feature. In an environment where heavy loads as well as light loads may be switched, the smart power switch may be a low on-resistance power switch for the heavy loads and may especially be able to provide accurate current sense at light loads, such as light emitting diodes (LED). For example, a smart power switch in an automobile environment may have the ability to drive high-intensity discharge (HID) xenon and halogen lamps and light-emitting diode light sources with a single device, thus improving lighting efficiency, extending bulb life and reducing material costs.

Figure 1:
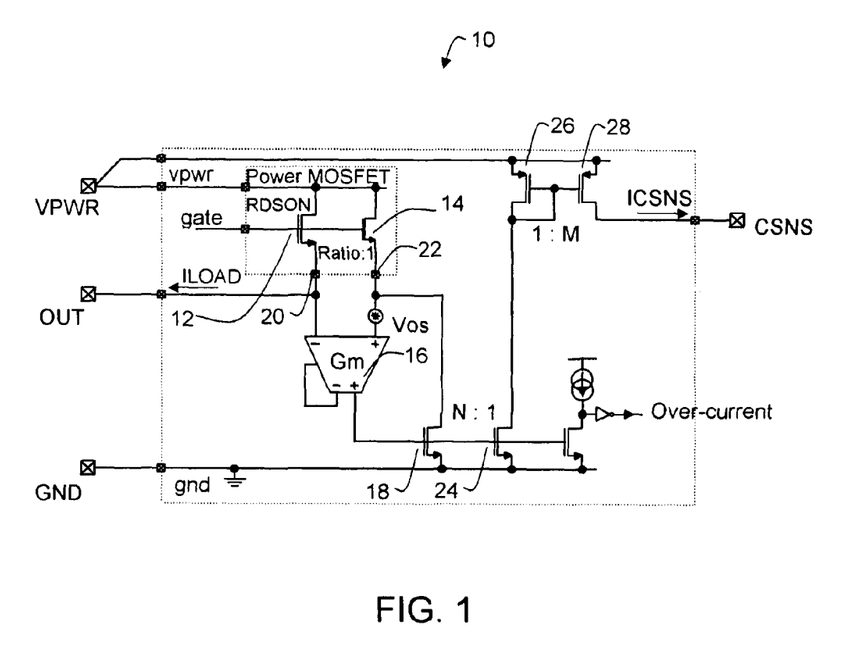
FIG. 1 schematically shows an example of a smart power switching circuit.

As shown in FIG. 1, a smart power switching circuit 10 may contain a regular load or output current monitoring and over-current protection circuit. The current sense functionality is implemented by separating the power switch in a (main) power switching device 12, a mirror, sense device 14 and by usage of a differential or error amplifier 16 to form an accurate current sense with an accuracy of the current sense function only limited at low load currents and/or at low on-resistance of the power switch by an error value introduced by the error amplifier offset. Current sense feedback in this circuit is formed by the error amplifier 16 and transistor 18. Current sense feedback (negative feedback) may keep equal voltage potentials on the sources 20, 22 of main power switching 14 and sense 16 transistors. So current through drain-source path of the sense transitor 14 as well as through transitor 18 thanks to the error amplifier 16 is proportional to the load current (ILOAD). As shown, this current may be replicated by replica MOSFETs 24, 26, 28 to output with some current gain (M/N in this example).

When error introduced by the offset of the error amplifier is sufficient at load current of interest, an approach for improving current sense accuracy is for example two points calibration of the power switching circuit, which includes individually characterizing each power switching circuit and saving obtained coefficients for use in a program for a microcontroller which controls the power switching circuit and measures current sense output by an embedded analog-to-digital converter (ADC). Other common techniques for offset reduction are for example, just to name a few: analog/digital offset compensation, auto-zeroing, chopping, offset stabilization and their various combinations.

SUMMARY OF THE INVENTION

The present invention provides a power switching apparatus and a method for improving current sense accuracy in a power switching apparatus as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated, for the understanding and appreciation of the underlying concepts of the present invention and in order not to obfuscate or distract from the teachings of the present invention.

Figure 2:
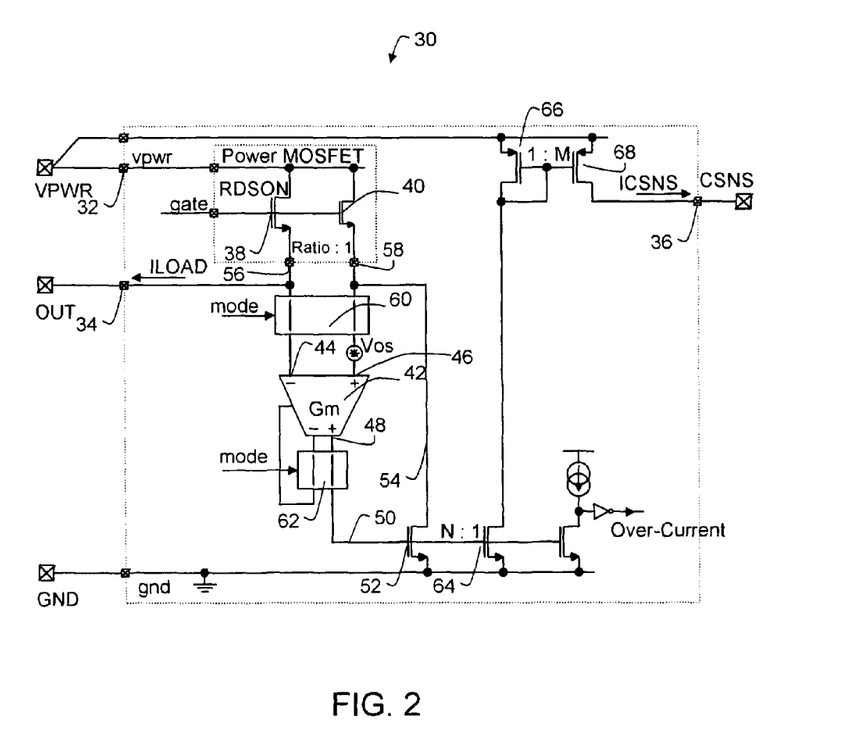
FIG. 2 schematically shows an example of an embodiment of a power switching circuit arrangement of a power switching apparatus in a first mode.

Referring to FIG. 2, an example of an embodiment of a power switching circuit arrangement 30 of a power switching apparatus in a first mode is shown. A power switching apparatus may comprise a power switching circuit arrangement 30 comprising an input 32 connectable to a power supply (VPWR), a first output 34 connectable to a load and a second output 36 arranged to provide a sense current (ICSNS) depending on a load current (ILOAD) flowing through the load. It may comprise a power switching device 38 and a sense device 40, such as for example transistors receiving a control or gate signal (gate). A power switching device 38 may for example be a metal oxide semiconductor field effect transistor (MOSFET) such as an N-channel MOSFET. In other embodiments, other switchable devices may be serve as a power switching device 38, for example a P-channel MOSFET transistor or a bipolar transistor.

A power switching circuit arrangement 30 may comprise a difference amplification device 42, such as for example the shown differential or error amplifier, comprising a first and a second amplifier input 44, 46, and at least one amplifier output 48 being connected to a current sense feedback loop 50, 52, 54 arranged to reduce a difference of potentials between the first and the second amplifier input; wherein a first terminal of the power switching device 38 and a first terminal of the sense device 40 are connected to the input 32 of the power switching circuit arrangement 30 and a second terminal 56 of the power switching device 38 and a second terminal 58 of the sense device 40 are coupled to a first cross-coupling switching module 60 arranged to connect, depending on a mode signal (mode), in a first mode the second terminal 56 of the power switching device 38 to the first input 44 of the difference amplification device 42 and the second terminal 58 of the sense device 40 to the second input 46 of the difference amplification device 42. A cross-coupling switching module 60 may for example comprise switching devices such as transistors in order to provide the desired functionality. In another embodiment, the module may for example be implemented using one or more multiplexer devices.

Figure 3:
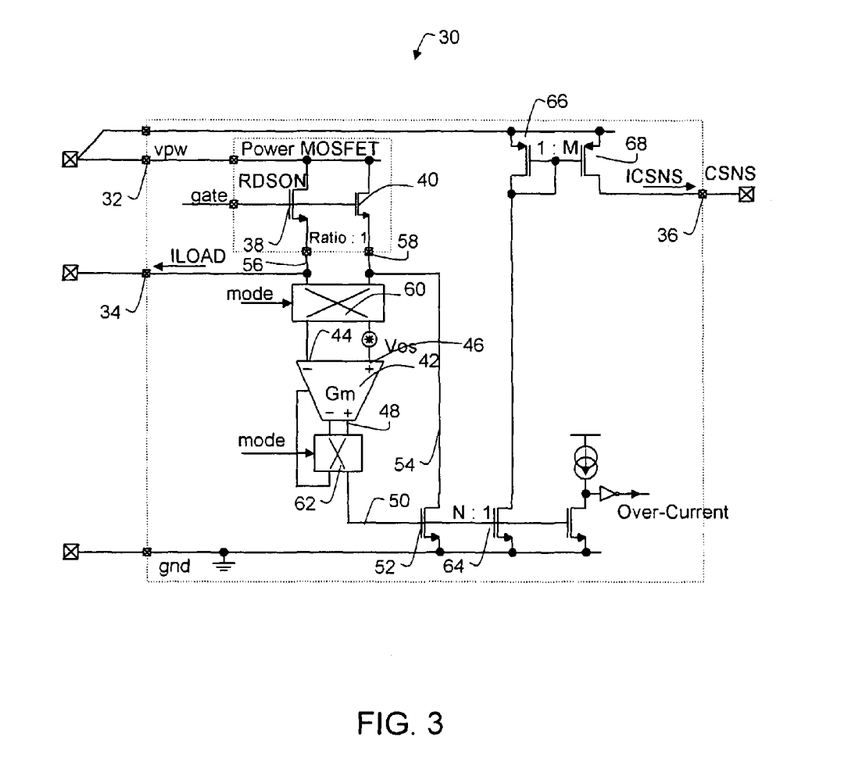
FIG. 3 schematically shows an example of an embodiment of a power switching circuit arrangement of a power switching apparatus in a second mode.

Referring also to FIG. 3, an example of an embodiment of a power switching circuit arrangement of a power switching apparatus in a second mode is shown. Only details of the shown circuit arrangement different from the power switching circuit arrangement shown in FIG. 2 will be described. Here, depending on the mode signal (mode), the first cross-coupling switching module 60 is in a second mode and arranged to connect in the second mode the second terminal 56 of the power switching device 38 to the second input 46 of the difference amplification device 42 and the second terminal 58 of the sense device 40 to the first input 44 of the difference amplification device 42.

Depending on the application of a changing mode signal, the shown power switching circuit arrangement 30 may be switched between first and second mode.

The power switching circuit arrangement 30 may comprise a second cross-coupling switching module 62, and the difference amplification module 42 may comprise a first and a second 48 amplifier output. The second cross-coupling switching module 62 may be arranged to connect, depending on the mode signal, in the first mode the second amplifier output 48 to the current sense feedback loop 50, 52, 54 and the first amplifier output to a control input of the difference amplification device 42 and in the second mode the first amplifier output to the current sense feedback loop and the second amplifier output 48 to the control input of the difference amplification device 42. This may allow to always keep negative feedback (38, 40, 42) regardless mode is set. In another embodiment, the module may for example be implemented by different mean in other part of circuitry and/or by using one or more multiplexer devices.

Referring to FIG. 2, the influence of the error amplifier offset on accuracy of current sense ratio CSNS output current in the shown power switching circuit may be calculated as ICSNS=(M/N)·(1/Ratio)·(ILOAD+Vos/RDSON) in a power switching circuit according to the example shown in FIG. 2, where "Ratio" refers to the electrical ratio between main and mirror power die devices ("Ratio" is defined as current through main power switching device 38 divided by current through sense device 40; voltages on their sources may be equal), ILOAD refers to the load current, Vos refers to the offset of the error amplifier 42, RDSON refers to the Drain-to-Source ON resistance of the shown main power switching device 38. Multiplier (M/N) refers to current gain for the given circuit (current through second output 36 (CSNS) divided by current through source 58 of sense device 40) formed by the two current mirrors 52, 64 (N:1) and 66, 68 (1:M). Thus (M/N) may be different in other embodiments.

Relation between sense and load current is frequently represented by current sense ratio (CSR) parameter which is CSR=ICSNS/ILOAD=(M/N)·(1/Ratio)·(1+Vos/(ILOAD·RDSON)). If assume zero offset, CSR will become CSR0=(M/N)·(1/Ratio) which is a circuit constant. Now CSR expression can be re-written as CSR=CSR0·(1+CSR_ERR), where CSR_ERR=Vos/(ILOAD·RDSON) is an error induced by the offset. Also a representative error current can be introduced IERR=Vos/RDSON which gives an alternative expression for CSR_ERR=IERR/ILOAD.

Referring also to FIG. 3, cross coupling switching module 60 allows exchanging inputs of the differenctial amplifier 42 or change a sign of the offset value to opposite one without changing in absolute value. When in first mode the current sense ratio output current at the second output 36 may be given as ICSNS1=(MN)·(1/Ratio)·(ILOAD+Vos/RDSON), and ICSNS2=(M/N)·(1/Ratio)·(ILOAD−Vos/RDSON) when in second mode. Hence, the shown power switching circuit arrangement may provide an output current ICSNS proportional to the load current ILOAD either as ICSNS1, i.e. increased by an offset voltage Vos or as ICSNS2, i.e. now decreased by the same value of offset voltage, depending on the currently applied mode. The presented system is arranged to provide the sense current either reduced or increased by the offset factor introduced by the difference amplification device 42, depending on the currently applied mode, and wherein the offset sign changes depending on a change in the applied mode signal. This may for example allow to select which kind of inaccuracy may be more suitable, i.e. less relevant, for the desired application of the power switching apparatus.

Figure 4:
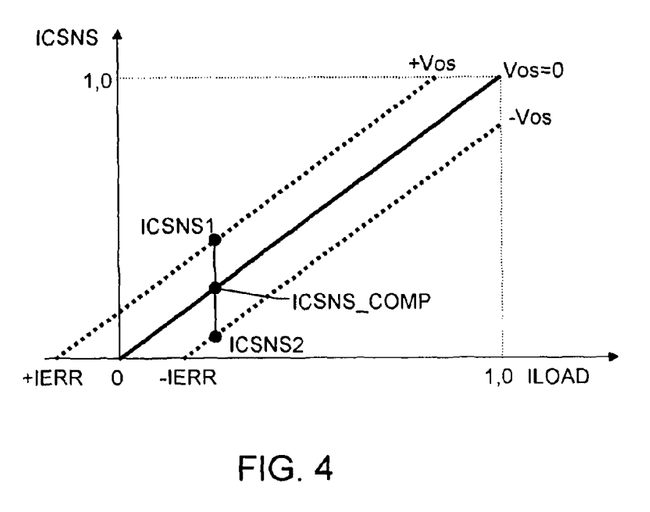
FIG. 4 schematically shows a diagram of an example sense current vs. load current.
Figure 5:
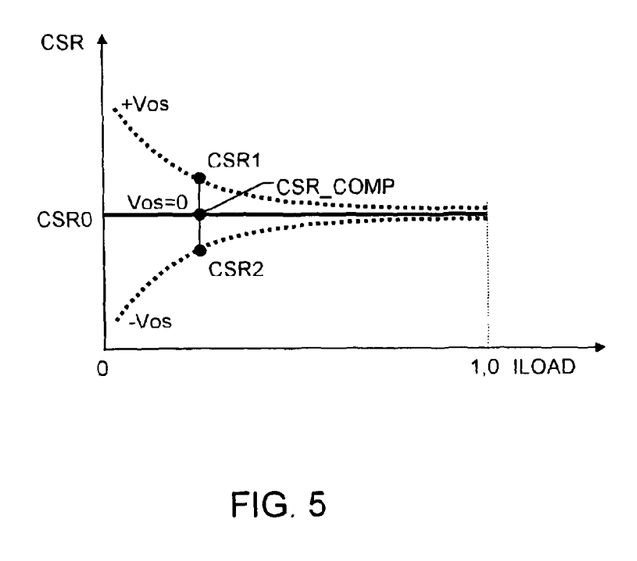
FIG. 5 schematically shows a diagram of an example current sense ratio vs. load current.

Influence of the offset on both ICSNS and CSR is illustrated in the example diagrams given in FIG. 4 and FIG. 5, respectively. It is shown that the offset may give an offset error in ICSNS vs. ILOAD dependence. CSR_ERR is inverse proportial to ILOAD and increases with the load current decrease and could be sufficient at low load currents. This behaviour can be observed by CSR vs. ILOAD dependence as shown in FIG. 5. The equal values of the offset with opposite signs may give symmetric shift of ICSNS and CSR values relative to zero offset value.

Averaging ICSNS1 and ICSNS2, for example measured in two sequential measurements, the first when in first mode and the second when in the second mode, may give ICSNS_COMP=(ICSNS1+ICSNS2)/2=(M/N)·(1/Ratio)·ILOAD or =CSR0·ILOAD, i.e. Vos/RDSON contribution caused by the offset may be excluded from the resulting offset compensated current value and ICSNS may be proportional to ILOAD. Subtracting two consecutive sense current values may give: (ICSNS1−ICSNS2)/2=(M/N)·(1/Ratio)·(Vos/RDSON)=CSR0·(Vos/RDSON), i.e. a value proportional to the error current IERR=Vos/RDSON. The similar expressions could be obtained for CSR1 and CSR2, e.g. CSR_COMP= (CSR1+CSR2)/2=CSR0.

Figure 6:
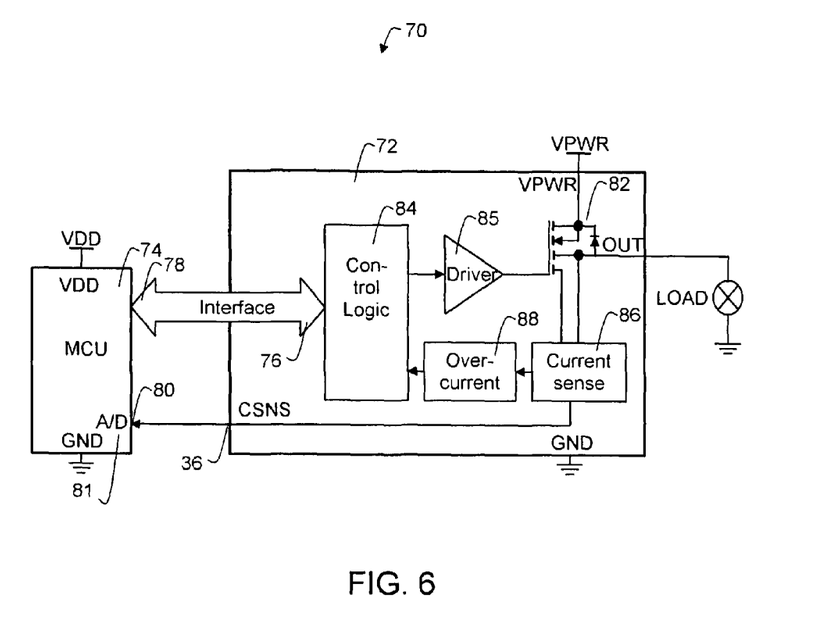
FIG. 6 schematically shows an embodiment of a power switching apparatus.

Referring also to FIG. 6, an example of an embodiment of a power switching apparatus 70 is schematically shown. The power switching apparatus 70 may comprise a processing device 74 comprising for example either a communication interface 78 or dedicated output connected to provide the mode signal to the both cross-coupling switching modules of the power switching circuit arrangement 72. From other side the mode signal to the cross-coupling switching modules may for example be formed inside the power switching circuit arrangement 72. In this case the processing device 74 may for example comprise a communication interface 78 or dedicated input through which it may be informed either about actual state of the mode signal or about event of the mode signal toggling (to synchronize embedded ADC).

The power switching apparatus 70 may comprise a sense current offset compensation module arranged to generate an offset compensated sense current from at least two sense current values (ICSNS) provided at the second output 36 (CSNS) of the power switching circuit arrangement. The first value of two may be taken when the cross-coupling module is in the first mode. The second value may be taken when the cross-coupling module is in the second mode. The compensation may for example be done on the basis of one pair of sense current values as well as on the basis of couple of pairs (1, 2, 3, . . . ). Also, here algorithms of digital low pass filtering may be applied (for pairs) to reduce or exclude noise influence. In the shown example embodiment, the power switching circuit arrangement 72 may be implemented as a separate integrated circuit connected to a processing device 74, which may for example be a microcontroller unit (MCU) or any other processing device. As shown, a power switching circuit arrangement 72 may be connected to a power supply (VPWR) and may comprise an output (OUT) connected to a load. It may for example comprise one or more additional outputs (OUT) for connecting to other heavy or light loads. The power switching circuit arrangement 72 may for example comprise a control logic module 84, for example controlling a driver device 85 driving the control input of the power switching device 82, which may for example be the gate of a power switching transistor, for example being integrated with the sense device and connected to a current sense module and over-current protection module 88, which may refer to the over-current protection circuit and current sense circuitry shown in FIG. 2 and FIG. 3.

A sense current offset compensation module may be implemented either as part of the power switching circuit arrangement 72, as a separate circuit, or may be part of the shown processing device 74. When implemented as part of the power switching circuit arrangement 72 of the power switching apparatus 70, it may be arranged for provision of offset compensated sense current values to the second output 36 (CSNS). Or the processing device 74 may be arranged to receive the sense current values, or a digitized information representing the sense current values, and perform the offset compensation. Depending on the processing device 74, it may be implemented using sets of computer instructions, for example when using an MCU processing device, or may be implemented with logic circuits, for example when using a programmable logic array. Generation of an offset compensated sense from the sense currents provided for the two modes may for example be achieved in a low-pass filtering circuit, but at the cost of slowing down the application, while in the shown embodiment having the processing device 74, e.g. an MCU, averaging each two values may provide for no such limitations.

As shown, the power switching circuit arrangement 72 may comprise a communication interface 76 connected to receive the mode signal and provide it to at least the first cross-coupling switching module, which may be part of the current sense module 86.

In an embodiment of the power switching apparatus, it may comprise a processing device 74 comprising a communication interface 78 connected to provide the mode signal at least to the first cross-coupling switching module. This may allow the processing device to trigger a mode change.

Communication is to be understood as transmission of a signal, e.g. carrying an information, from a sending device to a receiving device. Communication may for example be unidirectional or bi-directional. A communication interface may for example be a terminal for providing or receiving a communicated signal to or from a communication channel, such as for example a connecting line or wireless communication link, and may for example be a dedicated input or output. Or a communication interface may comprise an electronic circuit, for example designed to allow communication according to a specific standard, that enables communication between devices.

In an embodiment, the communication interface 78 of the processing device 74 may be a dedicated output. And the communication interface 76 of the power switching circuit arrangement 72 may be a second input, allowing for unidirectional communication of the mode signal to the power switching circuit arrangement 72. The mode signal may be a signal provided by the processing device 74 to the power switching circuit arrangement 72 through a dedicated output or through communication interface by special command or by a binary signal wherein for example a first level (e.g. bit value "0") may represent information "first mode" and a second level (e.g. bit value "1") may represent information "second mode".

Or in another embodiment, the communication interface 78 of the processing device 74 may be arranged for bidirectional communication, for example designed to a specific standard. It may for example be a serial peripheral (SPI) interface using a synchronous serial data link standard allowing for full duplex communication, or any other communication interface. Here, the mode signal may be provided for example as a binary SPI command, each of the binary states associated with the first or the second mode, respectively.

Referring also to FIG. 2 and FIG. 3, by the mode signal, the first and second inputs 44, 46 of the difference amplification device 42 may be swapped and its output may be taken from the opposite branch, allowing to change the sign of the offset introduced in initial configuration, and the offset impact on the resulting value will come with opposite sign. By averaging two measurements before and after the mode change, offset contribution may be fully cancelled, given that load current or other conditions have not changed significantly between these two measurements. Averaging may then be performed by the processing device 72 (e.g. MCU).

In another embodiment of the power switching apparatus 70, the power switching circuit arrangement 30, 72 may comprise a mode signal generation module arranged to generate the mode signal, i.e. the mode signal may be generated inside the power switching circuit arrangement 30, 72, e.g. by control logic module 84.

It should be noted that a mode signal may not only be defined by its mode signal levels. A mode signal may be a signal which carries a mode information, no matter if this information is encoded in the signal level or for example in a certain change of signal level. For example, in an embodiment the mode signal may be formed inside the power switching circuit arrangement 72 and the processing device 74 may just be informed about a "mode event" when the mode signal is changed. For example, a pulse negative edge may represent a mode change and may trigger reading a new sense current value, for example through an ADC 81 in the processing device 74. Because the mode signal may for example have two states and may be produced by the mode signal generation module, it may be derived from a mode event that the mode signal is alternated. So it may not be required for the processing device 74 to know the exact value of the mode signal. Here, the processing device 74 may perform at least two consecutive measurements, for example using embedded ADC 81 triggered by for example the negative edge of the special signal.

The mode signal may be a signal provided by the power switching circuit arrangement itself. In this case the processing device may be informed about actual state of the mode signal to control when the mode signal is changed. Or the processing device 72 may be informed when the mode signal is changed and actual information about the mode signal state might not be required especially assuming that the mode signal is alternated. In both above cases a dedicated output from the power switching circuit arrangement 72 or a communication interface (command or binary signal) may be used. Here, the power switching apparatus 70 may comprise a processing device 74 comprising a communication interface 78 connected to receive the mode signal from the mode signal generation module, which may also provide the mode signal to the cross-coupling switching modules. In this case, the power switching circuit arrangement 72 may comprise a communication interface 76 connected to provide the mode signal to the processing device 74. This may allow notifying the processing device 74 of a change of mode. Depending on the embodiment of the power switching apparatus 70, the mode signal may for example be provided by a processing device 74 such as an MCU by SPI command, provided by MCU by a dedicated signal or may be provided inside the power switching circuit arrangement 72.

The shown power switching apparatus 72 may have the processing device 74 comprising a sense current input 80 connected to the second output (CSNS) of the power switching circuit arrangement 72. The sense current input 80 may be an input dedicated to receive sense current values. As shown in FIG. 6, the processing device 74 may comprise an analog-to-digital converter 81 (A/D) connected to the sense current input 80. This may allow transmitting a continuous sense current or unquantized sense current value to the processing device 74. It should be noted that it is within the scope of the shown embodiment of the power switching apparatus 70 that an analog-to-digital converter 81 may be implemented within the power switching circuit arrangement 72, for example connected to provide analog-to-digital converted sense current values to the the second output 36 (CSNS) of the power switching circuit arrangement 72 for transmission of quantized sense current values to the sense current input 80 of the processing device 74 for further processing.

In another embodiment of the power switching apparatus, the sense current input 80 may be part of the communication interface 78 of the processing device. Here, the sense current may for example be digitized by an analog-to-digital converter of the power switching circuit arrangement 72, e.g. controlled or being integrated within the shown control logic module 84, and be reported to the processing device 74 through communication interface 76.

The processing device 74 may be arranged to receive the ICSNS current value. Receiving a mode change information via communication interface 78 may trigger the processing device to read an updated ICSNS current value. In an embodiment of the power switching apparatus 70, the communication interface 78 of the processing device 74 may be a dedicated input. And the communication interface 76 of the power switching circuit arrangement may be a third output, allowing for unidirectional communication of the mode signal to the processing device 74. Or in another embodiment, the communication interface 78 of the processing device 74 may, as described above, be arranged for bidirectional communication, for example designed to a specific standard. It may for example be a serial peripheral (SPI) interface using a synchronous serial data link standard allowing for full duplex communication or any other communication interface. Here, the sense current offset compensation module may be implemented as part of the processing device 74. As shown, the processing device 74 may control the output of the power switching circuit arrangement or may control and diagnose them via a communication interface or dedicated inputs/outputs.

Since the shown solution may be implemented in a processing device available anyway, the impact on required silicon area for power switching circuit arragement may be low, hence allowing for a low cost solution, while keeping compatibility with existing circuits (no full re-design, no high requirements to speed of error amplifier, no impact on EMC performance, no time for starting). If the power switching apparatus 70 is turned on for only short time duration, the shown system may allow offset compensation with almost no delay as compared to for example analog/digital offset compensation. Other approaches, such as for example auto-zeroing, chopping, offset stabilization and their various combinations may require a fast switching frequency which may not be achievable in high voltage designs of power switching applications.

The shown power switching device 82 may be a high-side switch, i.e. a switch suitable for switching a load circuit on and off at the supply voltage or high side of the circuit, allowing the load to be directly grounded on one side, avoiding an additional resistance on the low side of the load circuit. Just on given example, an N-channel MOSFET may be used. From other side the power switching device 28 may be a low-side switch with counterpart circuit where the same embodiment of the power switching apparatus and method for improving current sense accuracy could be applied.

The presented apparatus may allow uninterrupted current feedback, wherein two measurements may be enough for offset impact cancelling, while the introduced offset Vos/RDSON can still be extracted from two measurements.

The power switching apparatus 70 may comprise the power switching circuit arrangement 72 provided on a single integrated circuit die. A distribution of averaging, control functions and physical implementation between the processing device and the power switching circuit arragements may for example help reduce production costs and power consumption and compatibility to already existing solutions. Or the complete power switching apparatus may be provided on a single integrated circuit die. Other embodiments may comprise providing the power switching apparatus as a set of separate integrated circuits.

Figure 7:
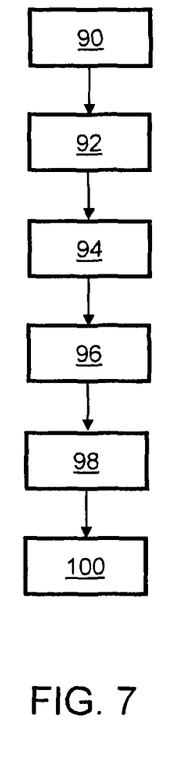
FIG. 7 schematically shows a flow diagram of an example of a method for improving current sense accuracy in a power switching apparatus.

Referring to FIG. 7, a flow diagram of an example of a method for improving current sense accuracy in a power switching apparatus is schematically shown. The illustrated method allows implementing the advantages and characteristics of the described power switching apparatus as part of a method for improving current sense accuracy in a power switching apparatus. The method comprises connecting a 90 first input of the power switching circuit arrangement to the power supply; connecting 92 the first output of the power switching circuit arrangement to a load; switching 94 the power switching device and the sense device into a connecting state; applying 96 the mode signal comprising a value associated with the first mode at least to the first cross-coupling switching module and receiving the sense current at the second output of the power switching circuit arrangement; and applying 98 the mode signal comprising a value associated with the second mode at least to the first cross-coupling switching module and receiving the sense current at the second output of the power switching circuit arrangement.

If the power switching apparatus comprises a sense current offset compensation module, the method may for example comprise generating 100 an offset compensated sense current by computing an average value from at least two values of sense current the first of which is provided at the second output of the power switching circuit arrangement when the first cross-coupling module is in the first mode and the second is provided when the first cross-coupling module is in the second mode.

A computer program product may comprise code portions for executing steps of a method for improving current sense accuracy in a power switching apparatus when run on a programmable apparatus. For example, the mode signal control and/or communication to the power switching circuit arrangement and/or the calculation of offset compensated current sense values may be implemented using computer instructions provided as a computer program product.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the shown power switching apparatus 70 may be implemented as a power switching circuit arrangement 72 and a separate processing device 74 or having the required circuitry for processing the ICSNS current values integrated in the power switching circuit arrangement 72.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the complete power switching apparatus 70 may be implemented on a single integrated circuit die. Alternatively, the examples may be implemented as any number of separate integrated circuits or separate devices interconnected with each other in a suitable manner. For example, the power switching apparatus 70 may be implemented using a power switching circuit arrangement die and a processing device die and may even have an offset compensation module implemented as a separate device.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A power switching apparatus comprising a power switching circuit arrangement, the power switching circuit arrangement comprising:
    an input connectable to a power supply;
    a first output connectable to a load;
    a second output arranged to provide a sense current depending on a load current flowing through said load;
    a power switching device;
    a sense device; and
    a difference amplification device comprising
        a first and a second amplifier input, and
        at least one amplifier output; and
    a current sense feedback loop, coupled to the at least one amplifier output, and arranged to reduce a difference of potentials between said first and said second amplifier input, wherein
    a first terminal of said power switching device and a first terminal of said sense device are connected to said input, and
    a second terminal of said power switching device and a second terminal of said sense device are coupled to a first cross-coupling switching module,
    the first cross-coupling switching module is arranged to connect, depending on a mode signal,
        in a first mode said second terminal of said power switching device to said first input of said difference amplification device and said second terminal of said sense device to said second input of said difference amplification device, and
        in a second mode said second terminal of said power switching device to said second input of said difference amplification device and said second terminal of said sense device to said first input of said difference amplification device.

2. The power switching apparatus as claimed in claim 1, wherein said power switching circuit arrangement further comprises:
    a second cross-coupling switching module; and
    said difference amplification module further comprises a first and a second amplifier output, wherein
        said second cross-coupling switching module is arranged to connect, depending on said mode signal,
        in said first mode said second amplifier output to said current sense feedback loop and said first amplifier output to a control input of said difference amplification device, and
        in said second mode said first amplifier output to said current sense feedback loop and said second amplifier output to said control input of said difference amplification device.

3. The power switching apparatus as claimed in claim 1, comprising:
    a sense current offset compensation module arranged to generate an offset compensated sense current from at least two values of sense current, wherein
        the first value of sense current is provided at said second output of said power switching circuit arrangement when said first cross-coupling module is in said first mode, and
        the second value of sense current is provided when said first cross-coupling module is in said second mode.

4. The power switching apparatus as claimed in claim 1, wherein said power switching circuit arrangement comprises a first communication interface connected to receive said mode signal and arranged to provide it to at least said first cross-coupling switching module.

5. The power switching apparatus as claimed in claim 4, comprising a processing device comprising a second communication interface connected to said first communication interface and arranged to provide said mode signal at least to said first cross-coupling switching module.

6. The power switching apparatus as claimed in claim 1, wherein said power switching circuit arrangement comprises a mode signal generation module arranged to generate said mode signal.

7. The power switching apparatus as claimed in claim 6, comprising a processing device comprising a first communication interface connected to receive said mode signal from said mode signal generation module.

8. The power switching apparatus as claimed in claim 7, wherein said power switching circuit arrangement comprises a second communication interface connected to said first communication interface and arranged to provide said mode signal to said processing device.

9. The power switching apparatus as claimed in claim 5, wherein said processing device comprises a sense current input connected to said second output of said power switching circuit arrangement.

10. The power switching apparatus as claimed in claim 1, wherein said power switching apparatus is provided on a single integrated circuit die.

11. A method for improving current sense accuracy in a power switching apparatus as claimed in claim 1; comprising:
   connecting a first input of said power switching circuit arrangement to said power supply;
   connecting said a first output of said power switching circuit arrangement to said load;
   switching said a power switching device and the sense device into a connecting state;
   applying a mode signal comprising a value associated with a first mode at least to said first cross-coupling switching module and receiving a sense current at a second output of said power switching circuit arrangement; and
   applying said mode signal comprising a value associated with a second mode at least to said first cross-coupling switching module and receiving said sense current at said second output of said power switching circuit arrangement.

12. The method as claimed in claim 10, wherein said power switching apparatus comprises a sense current offset compensation module, the method further comprising:
   generating an offset compensated sense current by computing an average value from at least two values of sense current the first of which is provided at said second output of said power switching circuit arrangement when said first cross-coupling module is in said first mode and the second is provided when said first cross-coupling module is in said second mode.

* * * * *